United States Patent
Yagi

(10) Patent No.: US 11,742,850 B2
(45) Date of Patent: Aug. 29, 2023

(54) DATA TRANSMISSION DEVICE

(71) Applicant: KIOXIA CORPORATION, Tokyo (JP)

(72) Inventor: Toshihiro Yagi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/984,035

(22) Filed: Aug. 3, 2020

(65) Prior Publication Data

US 2020/0366289 A1 Nov. 19, 2020

Related U.S. Application Data

(62) Division of application No. 15/689,865, filed on Aug. 29, 2017, now abandoned.

(30) Foreign Application Priority Data

Nov. 17, 2016 (JP) .............................. 2016-223842

(51) Int. Cl.
| | |
|---|---|
| *H03K 17/687* | (2006.01) |
| *H03K 19/0175* | (2006.01) |
| *G06F 1/10* | (2006.01) |
| *G06F 1/30* | (2006.01) |
| *H03L 7/081* | (2006.01) |

(52) U.S. Cl.
CPC .......... *H03K 17/6872* (2013.01); *G06F 1/10* (2013.01); *G06F 1/305* (2013.01); *H03K 19/017509* (2013.01); *H03L 7/0812* (2013.01)

(58) Field of Classification Search
CPC .......... H03K 17/164; H03K 19/00384; H03K 17/6872; H03L 7/0812; G06F 1/10; G06F 1/305
See application file for complete search history.

(56) References Cited

U.S. PATENT DOCUMENTS

| | | | |
|---|---|---|---|
| 7,332,930 B2 | 2/2008 | Mitsuishi | |
| 8,065,553 B2 | 11/2011 | Tamura et al. | |
| 8,299,822 B2 | 10/2012 | Shima et al. | |
| 2008/0106297 A1* | 5/2008 | Jao | H03K 17/164 326/27 |
| 2016/0173066 A1 | 6/2016 | Yang et al. | |

FOREIGN PATENT DOCUMENTS

| | | | |
|---|---|---|---|
| JP | 3507534 B2 | 3/2004 | |
| JP | 5087365 B2 | 12/2012 | |

* cited by examiner

*Primary Examiner* — Ryan Johnson
*Assistant Examiner* — Colleen J O Toole
(74) *Attorney, Agent, or Firm* — Kim & Stewart LLP

(57) ABSTRACT

According to one embodiment, a data transmission device includes a buffer circuit configured to set a voltage level of a data signal to high or low, a power supply line for supplying a power supply voltage to the buffer circuit, a buffer control circuit configured to control a switching operation of the buffer circuit, a current circuit configured to make a dummy current flow to the power supply line, and a current control circuit configured to control the dummy current based on one of the set voltage level and a transmission timing of the data signal.

8 Claims, 7 Drawing Sheets

DATA TRANSMISSION DEVICE

CROSS-REFERENCE TO RELATED APPLICATION

This application is a division of U.S. patent application Ser. No. 15/689,865, filed Aug. 29, 2017 which is based upon and claims the benefit of priority from Japanese Patent Application No. 2016-223842, filed Nov. 17, 2016, the entire contents of which are incorporated herein by reference.

FIELD

Embodiments described herein relate generally to a data transmission device.

BACKGROUND

In a data transmission device, a driver may be provided to set the level of transmission data to high or low. At this time, the power supply voltage varies due to the switching operation of the driver in some cases.

DETAILED DESCRIPTION

An embodiment provides a data transmission device capable of reducing variation in power supply voltage during data transmission.

In general, according to one embodiment, a data transmission device includes a buffer circuit configured to set a voltage level of a data signal to high or low, a power supply line for supplying a power supply voltage to the buffer circuit, a buffer control circuit configured to control a switching operation of the buffer circuit, a current circuit configured to make a dummy current flow to the power supply line, and a current control circuit configured to control the dummy current based on one of the set voltage level and a transmission timing of the data signal.

Hereinafter, a data transmission device according to an embodiment will be described in detail with reference to the attached drawings. The present disclosure is not limited to the embodiment.

First Embodiment

Figure 1:
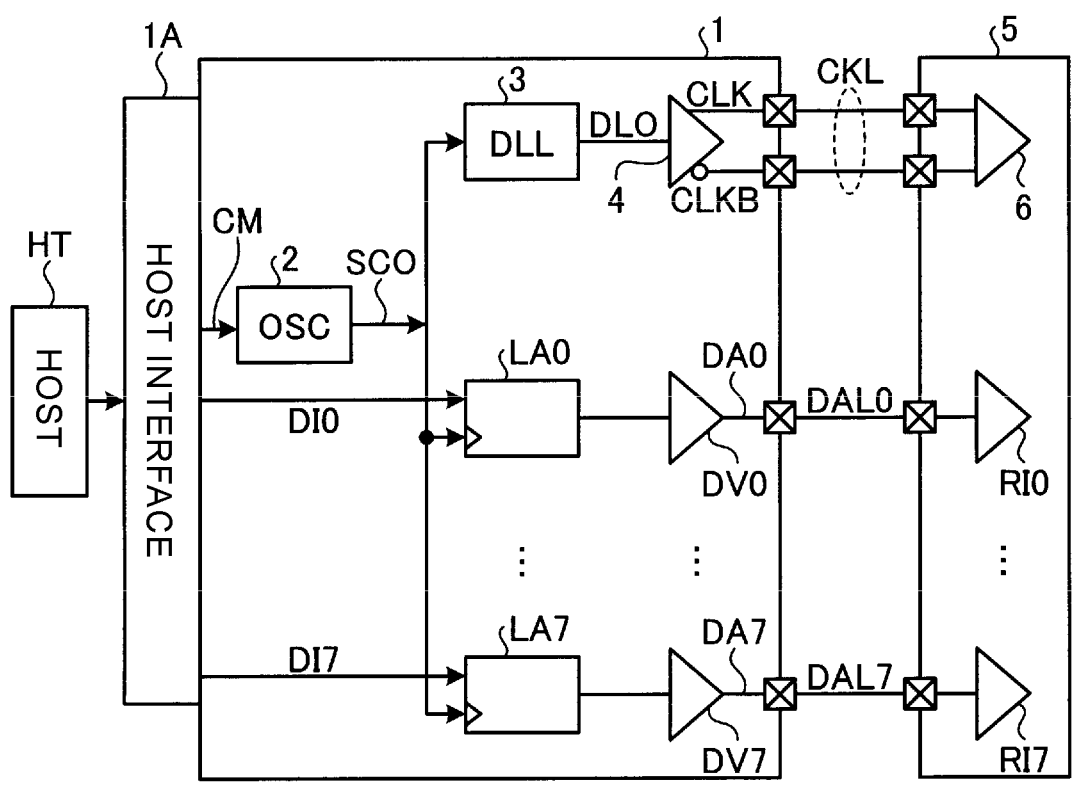
FIG. 1 is a block diagram illustrating a schematic configuration of a data communication apparatus according to a first embodiment.

FIG. 1 is a block diagram illustrating a schematic configuration of a data communication apparatus according to a first embodiment. In FIG. 1, the data communication apparatus includes a data transmission device 1 and a data reception device 5. The data transmission device 1 may be used as a transmission interface mounted on a semiconductor integrated circuit, and the data reception device 5 may be used as a reception interface mounted on a semiconductor integrated circuit. The data communication apparatus may be used, for example, for communication between a controller and a NAND memory, communication between a client and a server, communication between a host and a terminal, or communication between a base station and a portable terminal. In the embodiment illustrated in FIG. 1, transmission data DA0 to DA7 of 8 bits are transmitted from the data transmission device 1 to the data reception device 5. However, the transmission data to be transmitted from the data transmission device 1 to the data reception device 5 may have any number of bits.

The data transmission device 1 may be provided with a host interface 1A. The data transmission device 1 may be connected to a host HT via the host interface 1A. Further, the data transmission device 1 is provided with an oscillator 2, a delay locked loop (DLL) circuit 3, a clock driver 4, latch circuits LA0 to LA7, and data drivers DV0 to DV7. The data reception device 5 is provided with a clock receiver 6 and data receivers RI0 to RI7. The clock driver 4 and the clock receiver 6 are connected via a clock line CKL. The data drivers DV0 to DV7 and the data receivers RI0 to RI7 are connected via data lines DAL0 to DAL7, respectively.

The oscillator 2 is able to generate an oscillation signal SCO. At this time, the oscillator 2 may output the oscillation signal SCO based on a command signal CM from the host HT. The DLL circuit 3 is able to lock the oscillation signal SCO at a predetermined phase. The clock driver 4 is able to generate differential clock signals CLK and CLKB based on a DLL output DLO from the DLL circuit 3. The latch circuits LA0 to LA7 are able to latch input data DI0 to DI7, respectively, according to the oscillation signal SCO. The data drivers DV0 to DV7 are able to generate transmission data DA0 to DA7 based on the input data DI0 to DI7, respectively. At this time, the data drivers DV0 to DV7 may output the transmission data DA0 to DA7 by converting the voltage levels of the input data DI0 to DI7.

The clock receiver 6 is able to receive the differential clock signals CLK and CLKB transmitted from the clock driver 4. The data receivers RI0 to RI7 are able to receive the transmission data DA0 to DA7 transmitted from the data drivers DV0 to DV7, respectively.

Figure 2:
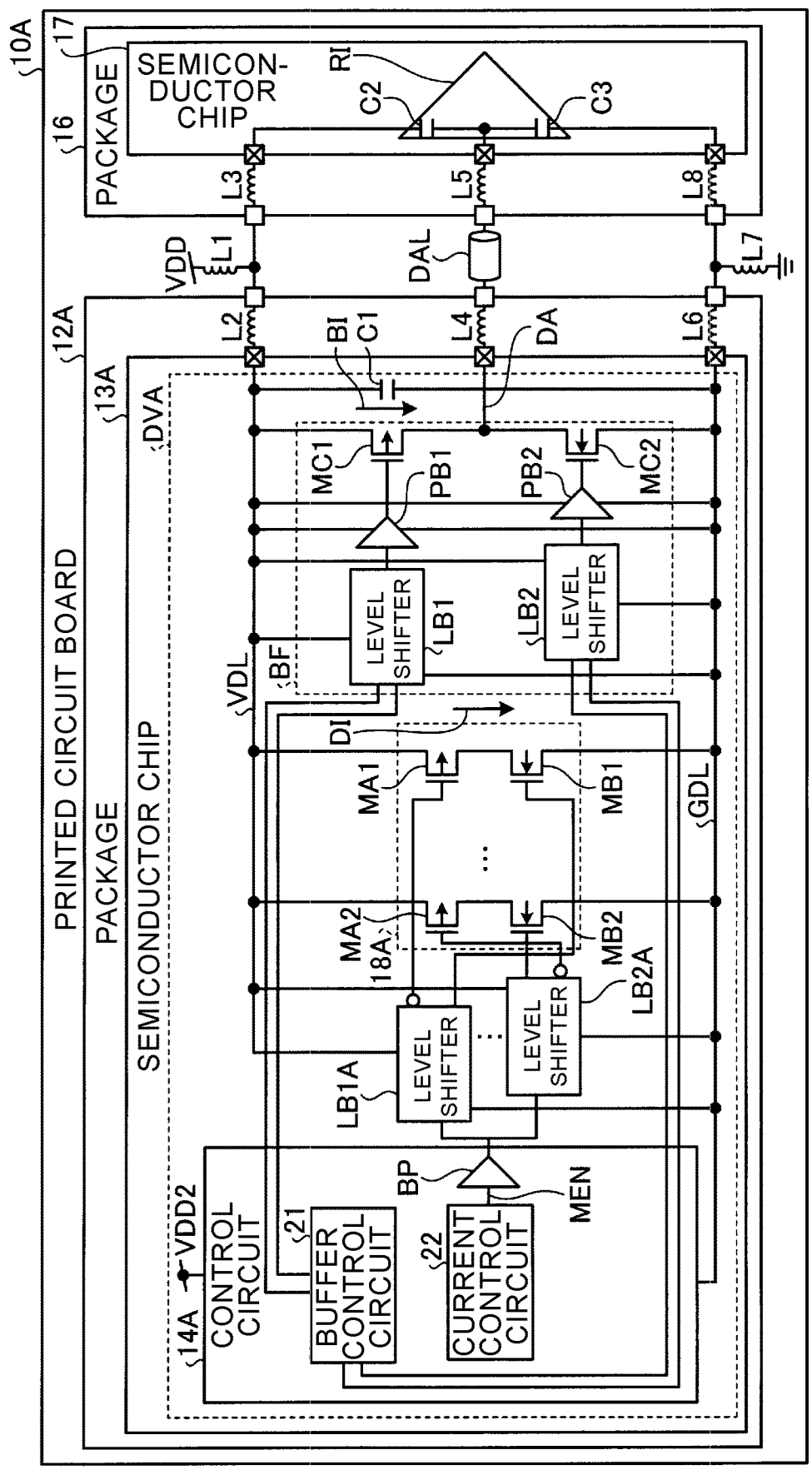
FIG. 2 is a block diagram illustrating a schematic configuration of a transmission interface circuit used in a data transmission device according to the first embodiment.

FIG. 2 is a block diagram illustrating a schematic configuration of a transmission interface circuit used in the data transmission device according to the first embodiment. In FIG. 2, only one of the data drivers DV0 to DV7 in FIG. 1 is illustrated. In FIG. 2, a semiconductor chip 13A is sealed in a package 12A, and a semiconductor chip 17 is sealed in a package 16. The packages 12A and 16 are mounted on a printed circuit board 10A.

The semiconductor chip 13A is formed with a data driver DVA. The data driver DVA is provided with a control circuit 14A, level shifters LB1A and LB2A, a current circuit 18A, and a buffer circuit BF. A power supply voltage VDD2 is supplied to the control circuit 14A. A power supply voltage VDD is supplied to the level shifters LB1A and LB2A, the current circuit 18A, and the buffer circuit BF. Further, the data driver DVA is provided with a power supply line VDL. The power supply line VDL supplies the power supply voltage VDD to the level shifters LB1A and LB2A, the current circuit 18A, and the buffer circuit BF. The power supply voltage VDD2 may be set to be lower than the power supply voltage VDD. For example, the power supply voltage VDD may be set to 1.2 V to 1.8 V or 3.3 V. The power supply voltage VDD2 may be set to 0.9 V to 1.1 V. Further, the data driver DVA is provided with a ground line GDL. The ground line GDL grounds the control circuit 14A, the level shifters LB1A and LB2A, the current circuit 18A, and the buffer circuit BF.

The buffer circuit BF is able to set the level of transmission data DA to high or low. The buffer circuit BF is provided with level shifters LB1 and LB2, pre-buffers PB1 and PB2, and output buffers MC1 and MC2. The output buffer MC1 may be a P-channel transistor, and the output buffer MC2 may be an N-channel transistor. The level shifters LB1 and LB2 are able to convert the level of the output voltage and drive the pre-buffers PB1 and PB2. For example, the level shifters LB1 and LB2 may specify the level of the output voltage with the power supply voltage VDD when the level of the input voltage is specified by the power supply voltage VDD2. Differential inputs may be used for the level shifters LB1 and LB2.

The output buffers MC1 and MC2 are connected in series to each other, and the series circuit is connected between the power supply line VDL and the ground line GDL. The output of the level shifter LB1 is connected to the input of the pre-buffer PB1, and the output of the pre-buffer PB1 is connected to the gate of the output buffer MC1. The output of the level shifter LB2 is connected to the input of the pre-buffer PB2, and the output of the pre-buffer PB2 is connected to the gate of the output buffer MC2.

The current circuit 18A is able to make a dummy current DI flow to the power supply line VDL. The current circuit 18A may be connected in parallel with the buffer circuit BF between the power supply line VDL and the ground line GDL. The current circuit 18A may make the dummy current DI flow complementarily to the buffer current BI flowing through the buffer circuit BF before the transmission data DA is transmitted together with the differential clock signals CLK and CLKB or when the transmission data DA is transmitted together with the differential clock signals CLK and CLKB. The current circuit 18A is provided with P-channel transistors MA1 and MA2 and N-channel transistors MB1 and MB2.

The P-channel transistors MA1 and MA2 and the N-channel transistors MB1 and MB2 are connected in series with each other. The series circuit of the P-channel transistor MA1 and the N-channel transistor MB1 and the series circuit of the P-channel transistor MA2 and the N-channel transistor MB2 are connected in parallel with each other between the power supply line VDL and the ground line GDL. The current circuit 18A may be provided with K (K is a positive integer) series circuits of P-channel transistors and N-channel transistors, and these K series circuits are connected in parallel with each other between the power supply line VDL and the ground line GDL.

The level shifters LB1A and LB2A are able to convert the level of the output voltage and drive the current circuit 18A. An inverted output of the level shifter LB1A is connected to the gate of the P-channel transistor MA1. A non-inverted output of the level shifter LB1A is connected to the gate of the N-channel transistor MB1. An inverted output of the level shifter LB2A is connected to the gate of the P-channel transistor MA2. A non-inverted output of the level shifter LB2A is connected to the gate of the N-channel transistor MB2. When only K series circuits of the P-channel transistors and the N-channel transistors are provided in the current circuit 18A, K level shifters may be provided in accordance with the serial circuits.

The dummy current DI flowing through the current circuit 18A and the buffer current BI flowing through the buffer circuit BF may be equalized by adjusting the number of series circuits of the P-channel transistors and the N-channel transistors in the current circuit 18A according to the driving force of the output buffers MC1 and MC2.

The control circuit 14A is able to control the switching operation of the current circuit 18A and the buffer circuit BF. The control circuit 14A is provided with a buffer control circuit 21 and a current control circuit 22. The buffer control circuit 21 is able to control the switching operation of the buffer circuit BF based on the level set in the transmission data DA. The output of the buffer control circuit 21 is connected to the inputs of the level shifters LB1 and LB2. The current control circuit 22 is able to control the dummy current DI based on the level set in the transmission data DA or a transmission timing of the transmission data DA. The output of the current control circuit 22 is connected to the inputs of the level shifters LB1A and LB2A via the buffer BP. The current control circuit 22 may individually drive each of the level shifters LB1A and LB2A. The current control circuit 22 is able to set the level of a dummy enable signal MEN to high when turning on the dummy current DI, and to set the level of the dummy enable signal MEN to low when turning off the dummy current DI.

Further, a capacitor C1 is connected between the power supply line VDL and the ground line GDL. An on-chip capacitor formed on the semiconductor chip 13A may be used for the capacitor C1.

Meanwhile, the semiconductor chip 17 is formed with a data receiver RI. The input of the data receiver RI is connected to the output of the buffer circuit BF via a transmission line DAL. The transmission line DAL may use a printed wiring of a printed circuit board 10A. The power supply voltage VDD is supplied to the data receiver RI. In the semiconductor chip 17, a parasitic capacitance C2 is formed on the power supply side of the data receiver RI, and a parasitic capacitance C3 is formed on the ground side of the data receiver RI.

Parasitic inductances L2, L4, and L6 are formed in the package 12A, parasitic inductances L3, L5, and L8 are formed in the package 16, and parasitic inductances L1 and L7 are formed in the printed circuit board 10A. The power supply voltage VDD is supplied to the power supply line VDL via the parasitic inductances L1 and L2, and is supplied to the data receiver RI via the parasitic inductances L1 and L3. The ground line GDL is grounded via the parasitic inductances L6 and L7, and the data receiver RI is grounded via the parasitic inductances L8 and L7. The transmission line DAL is connected to the buffer circuit BF via the parasitic inductance L4, and is connected to the data receiver RI via the parasitic inductance L5.

In the case where the configuration of the data driver DVA in FIG. 2 is applied to each of the data drivers DV0 to DV7 in FIG. 1, the power supply voltage VDD is supplied to the clock driver 4 and the data drivers DV0 to DV7. Therefore, the parasitic inductance L1 is common to the clock driver 4 and the data drivers DV0 to DV7. Further, the clock driver 4 and the data drivers DV0 to DV7 are grounded. Therefore, the parasitic inductance L7 is also common to the clock driver 4 and the data drivers DV0 to DV7.

Before the transmission data DA is transmitted from the buffer circuit BF, the buffer control circuit 21 turns off the output buffer MC1 and turns on the output buffer MC2. Therefore, the level of the transmission data DA is set to low. At this time, the buffer current BI does not flow through the buffer circuit BF.

When the transmission data DA is transmitted from the buffer circuit BF, the output buffers MC1 and MC2 are turned on/off according to the value of the transmission data DA. At this time, when setting the level of the transmission data DA to high, the buffer control circuit 21 turns on the output buffer MC1 and turns off the output buffer MC2. When setting the level of the transmission data DA to low, the buffer control circuit 21 turns off the output buffer MC1 and turns on the output buffer MC2.

When the level of the transmission data DA is low, the buffer current BI does not flow through the buffer circuit BF. When the level of the transmission data DA is high, the buffer current BI flows through the buffer circuit BF. Therefore, when the level of the transmission data DA is switched, the buffer current BI is increased or decreased. The buffer current BI is supplied from the power supply voltage VDD via the power supply line VDL. Here, the parasitic inductances L1 and L2 are present between the power supply voltage VDD and the power supply line VDL. When the parasitic inductances L1 and L2 are present, an induced electromotive force occurs in the parasitic inductances L1 and L2 according to a change in the current flowing therethrough so that the followability of a power supply voltage VDDIO of the power supply line VDL with respect to the power supply voltage VDD is reduced.

Here, when the capacitor C1 is connected between the power supply line VDL and the ground line GDL, it is possible to compensate for the reduction in followability of the power supply voltage VDDIO to some extent. That is, when the buffer current BI supplied from the power supply voltage VDD is less likely to flow due to the parasitic inductances L1 and L2, the buffer current BI may be compensated from the capacitor C1. However, in order for the capacitor C1 to sufficiently compensate the buffer current BI, it is necessary to increase the capacitor C1, which in turn causes an increase in the chip size of the semiconductor chip 13A. When the capacitor C1 is an on-chip capacitor, the parasitic inductance may be reduced as compared with an embodiment in which the capacitor C1 is externally attached. Thus, the buffer current BI may be effectively supplied from the capacitor C1.

Therefore, the data driver DVA makes the buffer current BI flow based on the level set in the transmission data DA. At this time, the dummy current DI may be made to flow so as to compensate for the reduction in the buffer current BI before the transmission data DA is transmitted and while the transmission data DA is transmitted.

That is, in the current control circuit 22, the dummy enable signal MEN rises when the level of the transmission data DA is low. At this time, the P-channel transistors MA1 and MA2 and the N-channel transistors MB1 and MB2 are turned on, and the dummy current DI flows through the current circuit 18A. The current value of the dummy current DI and the current value of the buffer current BI may be made equal to each other.

Meanwhile, in the current control circuit 22, the dummy enable signal MEN falls when the level of the transmission data DA is high. At this time, the P-channel transistors MA1 and MA2 and the N-channel transistors MB1 and MB2 are turned off, and the dummy current DI does not flow through the current circuit 18A.

As a result, when the buffer current BI does not flow, the dummy current DI may flow instead. Therefore, the current flowing from the power supply voltage VDD to the power supply line VDL may be kept constant without depending on the level of the transmission data DA, and the occurrence of the induced electromotive force by the parasitic inductances L1 and L2 may be prevented. Thus, while the transmission data DA is transmitted, the followability of the power supply voltage VDDIO with respect to the power supply voltage VDD may be improved, and variation in the power supply voltage VDDIO caused by the switching operation of the buffer circuit BF may be reduced. In addition, by providing the current circuit 18A in the data driver DVA, the parasitic resistance and parasitic inductance may be reduced compared with a method of externally attaching the current circuit 18A.

Figure 3:
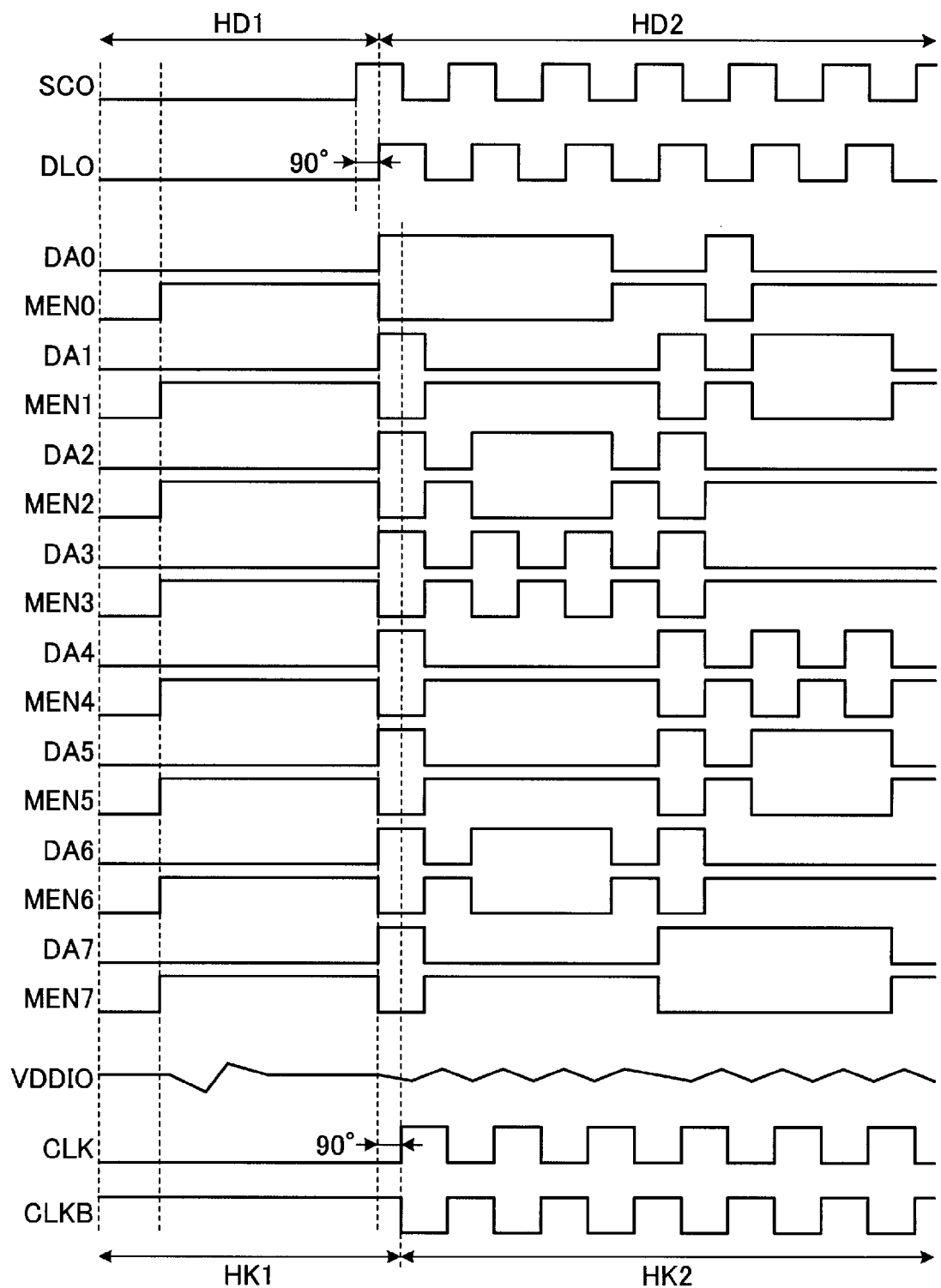
FIG. 3 is a timing chart illustrating waveforms of respective parts of the data transmission device according to the first embodiment.

FIG. 3 is a timing chart illustrating waveforms of respective parts of the data transmission device according to the first embodiment. FIG. 3 illustrates output waveforms of the clock driver 4 and the data drivers DV0 to DV7 in FIG. 1 in a case where the configuration of the data driver DVA in FIG. 2 is applied to each of the data drivers DV0 to DV7 in FIG. 1. The dummy enable signal MEN output from the current control circuit 22 in FIG. 2 may be set for each of the data drivers DV0 to DV7. In the example of FIG. 3, the dummy enable signals of the data drivers DV0 to DV7 are denoted as MEN0 to MEN7, respectively.

In FIG. 3, a clock non-transmission period HK1 and a clock transmission period HK2 are provided in the data driver DVA of FIG. 2. The differential clock signals CLK and CLKB are transmitted in the clock transmission period HK2, and the differential clock signals CLK and CLKB are not transmitted in the clock non-transmission period HK1. In addition, a data non-transmission period HD1 and a data transmission period HD2 are provided in the data driver DVA of FIG. 2. The transmission data DA0 to DA7 are transmitted during the data transmission period HD2, and the transmission data DA0 to DA7 are not transmitted during the data non-transmission period HD1.

In the clock non-transmission period HK1, when the command signal CM is transmitted from the host HT in FIG. 1, the oscillation signal SCO is output from the oscillator 2 and input to the DLL circuit 3 and the latch circuits LA0 to LA7. In the DLL circuit 3, the phase of the oscillation signal SCO is delayed by 90° so that the DLL output DLO is generated and input to the clock driver 4. In the clock driver 4, the DLL output DLO is inverted, and the phases of the DLL output DLO and its inverted signal are delayed by 90° so that the differential clock signals CLK and CLKB are generated. Then, it shifts to the clock transmission period HK2. In the clock transmission period HK2, the differential clock signals CLK and CLKB are transmitted from the clock driver 4 to the clock receiver 6.

Meanwhile, when the input data DI0 to DI7 are input to the latch circuits LA0 to LA7 from the host HT in the data non-transmission period HD1, the input data DI0 to DI7 are latched, respectively, according to the oscillation signal SCO, and output to the data drivers DV0 to DV7. Then, in the respective data drivers DV0 to DV7, the voltage levels of the input data DI0 to DI7 are converted to generate the transmission data DA0 to DA7. Then, it shifts to the data transmission period HD2. In the data transmission period HD2, the transmission data DA0 to DA7 are transmitted from the data drivers DV0 to DV7 to the data receivers RI0 to RI7, respectively.

At this time, the transmission data DA0 to DA7 may advance in phase by 90° relative to the differential clock signals CLK and CLKB. As a result, it is possible to sample the transmission data DA0 to DA7 at the center between the rising edge and the falling edge of the transmission data DA0 to DA7. In addition, it is possible to improve the determination accuracy of the voltage levels of the transmission data DA0 to DA7.

Here, in the data non-transmission period HD1, the dummy enable signals MEN0 to MEN7 rise before the differential clock signals CLK and CLKB are transmitted. At this time, in each of the data drivers DV0 to DV7, the buffer current BI in FIG. 2 does not flow while the dummy current DI flows.

Further, in the data transmission period HD2, the dummy enable signals MEN0 to MEN7 fall when the level of the transmission data DA is high. At this time, in each of the data drivers DV0 to DV7, the buffer current BI in FIG. 2 flows while the dummy current DI does not flow. Meanwhile, the dummy enable signals MEN0 to MEN7 rise when the level of the transmission data DA is low. At this time, in each of the data drivers DV0 to DV7, the buffer current BI in FIG. 2 does not flow but the dummy current DI flows.

As a result, before the transmission data DA0 to DA7 are transmitted and while the transmission data DA0 to DA7 are transmitted, the current flowing from the power supply voltage VDD to the power supply line VDL may be kept constant without depending on the level of the transmission data DA0 to DA7. Therefore, even when the parasitic inductances L1 and L2 are present between the power supply voltage VDD and the power supply line VDL, it is possible to reduce the variation in the power supply voltage VDDIO caused by the switching operation of the buffer circuit BF in the data transmission period HD2. As a result, it is possible to reduce the deviation of the duty ratios of the differential clock signals CLK and CLKB, and to reduce the skew between the differential clock signals CLK and CLKB and the transmission data DA0 to DA7.

In the data non-transmission period HD1, when the dummy current DI flows through the data drivers DV0 to DV7, the power supply voltage VDDIO is temporarily lowered. At this time, the differential clock signals CLK and CLKB and the transmission data DA0 to DA7 are not transmitted. Therefore, deviations in the duty ratios of the differential clock signals CLK and CLKB and skew between the differential clock signals CLK and CLKB and the transmission data DA0 to DA7 do not occur.

Second Embodiment

Figure 4:
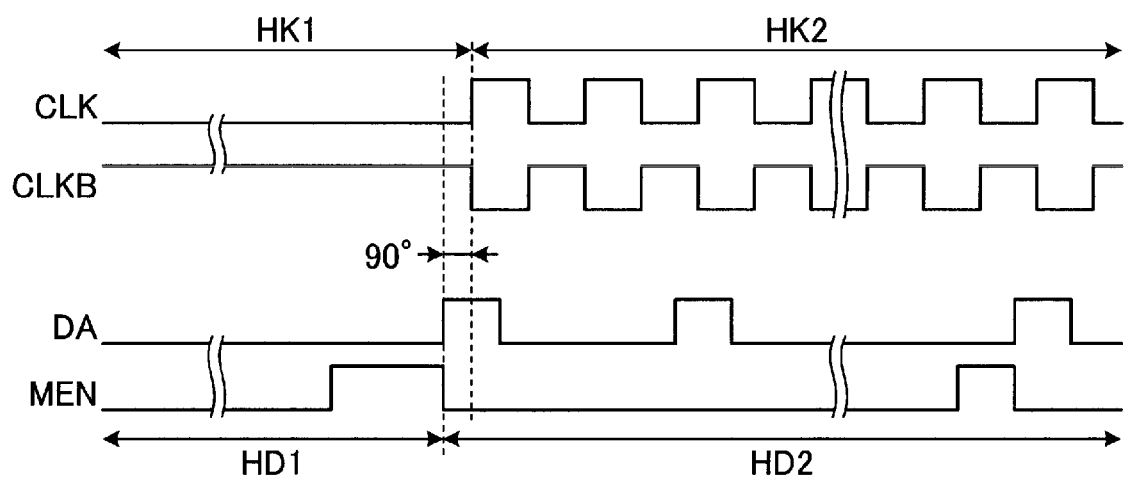
FIG. 4 is a timing chart illustrating waveforms of respective parts of a data transmission device according to a second embodiment.

FIG. 4 is a timing chart illustrating waveforms of respective parts of a data transmission device according to a second embodiment. FIG. 4 illustrates output waveforms of the clock driver 4 in FIG. 1 and one data driver DVA in FIG. 2.

In FIG. 4, a clock non-transmission period HK1, a clock transmission period HK2, a data non-transmission period HD1, and a data transmission period HD2 are provided as in the timing chart of FIG. 3. Here, in the data non-transmission period HD1, the dummy enable signal MEN rises before the differential clock signals CLK and CLKB are transmitted. At this time, in the data driver DVA of FIG. 2, the buffer current BI does not flow but the dummy current DI flows. This point is the same as in the timing chart of FIG. 3.

However, in the method of FIG. 3, when the level of the transmission data DA is low in the data transmission period HD2, the dummy enable signal MEN rises. At this time, in each of the data drivers DV0 to DV7, the buffer current BI in FIG. 2 does not flow but the dummy current DI flows. On the other hand, in the method of FIG. 4, when the low level of the transmission data DA continues N (N is an integer of 2 or more) times or more in the data transmission period HD2, the dummy enable signal MEN rises in the last low level period.

For example, when N=32, the dummy enable signal MEN remains at the low level when the low level of the transmission data DA continues three times. Meanwhile, when the low level of the transmission data DA continues 50 times, the dummy enable signal MEN remains at the low level at the 1st to 31st times of the low level of the transmission data DA, and the dummy enable signal MEN attains a high level at the 32nd time of the transmission data DA.

Here, when the transmission data DA rises after the low level of the transmission data DA continues for a short time, the current flowing through the power supply line VDL at the previous rise of the transmission data DA may be left to some extent also at the current rise of the transmission data DA. Therefore, it is possible to prevent a sharp increase in the current flowing through the power supply line VDL at the current rise of the transmission data DA. In addition, it is possible to suppress variation in the power supply voltage VDDIO caused by the switching operation of the buffer circuit BF. At this time, even when the transmission data DA is at the low level, the dummy enable signal MEN may remain at a low level such that the dummy current DI does not flow. Thus, an increase in current consumption may be suppressed.

Meanwhile, when the transmission data DA rises after the low level of the transmission data DA continues for a long time, the current flowing through the power supply line VDL at the previous rise of the transmission data DA is hardly left at the current rise of the transmission data DA. Therefore, the dummy enable signal MEN is caused to rise during the last low level period after the low level of the transmission data DA continues for a long time, so that the dummy current DI flows. Thus, it is possible to prevent a sharp increase in the current flowing through the power supply line VDL at the current rise of the transmission data DA. In addition, it is possible to suppress variation in the power supply voltage VDDIO caused by the switching operation of the buffer circuit BF.

In order to monitor the number of consecutive times of the low level of the transmission data DA, a counter may be provided in the data driver DVA of FIG. 2.

Third Embodiment

Figure 5:
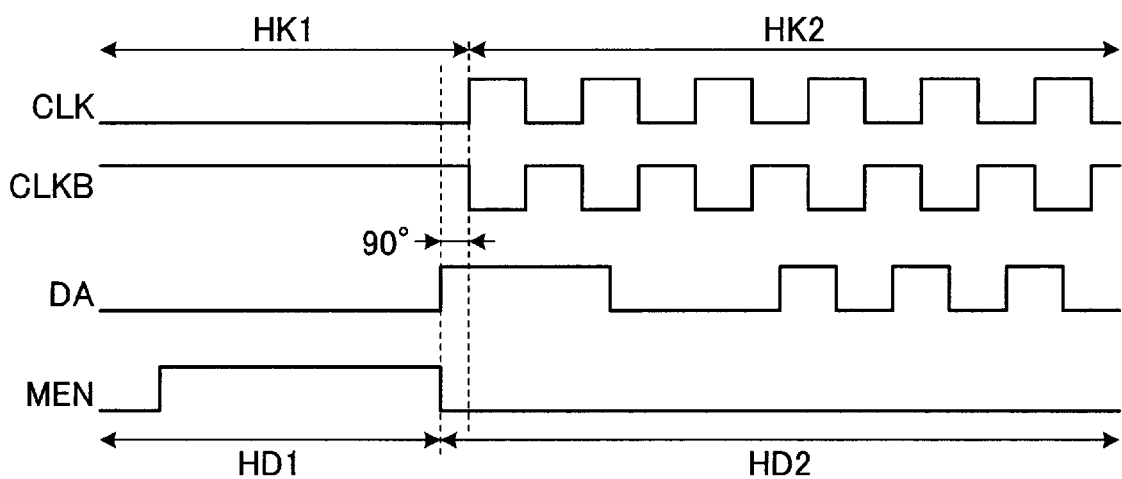
FIG. 5 is a timing chart illustrating waveforms of respective parts of a data transmission device according to a third embodiment.

FIG. 5 is a timing chart illustrating waveforms of respective parts of a data transmission device according to a third embodiment. FIG. 5 illustrates output waveforms of the clock driver 4 in FIG. 1 and one data driver DVA in FIG. 2. In FIG. 5, a clock non-transmission period HK1, a clock transmission period HK2, a data non-transmission period HD1, and a data transmission period HD2 are provided as in the timing chart of FIG. 4. Here, in the data non-transmission period HD1, the dummy enable signal MEN rises before the differential clock signals CLK and CLKB are transmitted. At this time, in the data driver DVA of FIG. 2, the buffer current BI does not flow but the dummy current DI flows. This point is the same as in the timing chart of FIG. 4.

However, in the method of FIG. 4, when the low level of the transmission data DA continues N times or more in the data transmission period HD2, the dummy enable signal MEN rises in the last low level period. In contrast, in the method of FIG. 5, the dummy enable signal MEN remains at the low level in the data transmission period HD2, and the dummy current DI does not flow.

Here, in the data transmission period HD2, the differential clock signals CLK and CLKB alternately repeat the low level and the high level. In addition, the power supply voltage VDD is supplied not only to the data driver DVA of FIG. 2 but also to the clock driver 4 of FIG. 1, and the parasitic inductances L1 and L2 are common to the data driver DVA and the clock driver 4. In the data transmission period HD2, even when the transmission data DA remains at the low level, a certain amount of current flows through the parasitic inductances L1 and L2. Therefore, when the transmission data DA rises in the clock transmission period HK2, the sharpness of the current change of the power supply line VDL may be reduced compared with the case where the transmission data DA rises in the clock non-transmission period HK1. Thus, it is possible to suppress the variation in the power supply voltage VDDIO caused by the switching operation of the buffer circuit BF. In the data transmission period HD2, even when the transmission data DA is at the low level, the dummy enable signal MEN remains at a low level such that the dummy current DI does not flow. Thus, an increase in current consumption may be suppressed.

Meanwhile, when the transmission data DA rises at the time of shifting from the data non-transmission period HD1 to the data transmission period HD2, the levels of the differential clock signals CLK and CLKB remain constant before the data transmission period HD2, so that no current flows through the parasitic inductances L1 and L2. When the transmission data DA rises at the time of shifting from the data non-transmission period HD1 to the data transmission period HD2, the sharpness of the current change of the power supply line VDL is increased. Therefore, when the transmission data DA rises at the time of shifting from the data non-transmission period HD1 to the data transmission period HD2, the dummy enable signal MEN rises before the transmission data DA rises, so that the dummy current DI flows. Accordingly, it is possible to prevent a sharp increase in the current flowing through the power supply line VDL at the rising edge of the transmission data DA at the time of shifting from the data non-transmission period HD1 to the data transmission period HD2. Thus, it is possible to suppress variation in the power supply voltage VDDIO, which is caused by the switching operation of the buffer circuit BF.

Fourth Embodiment

Figure 6:
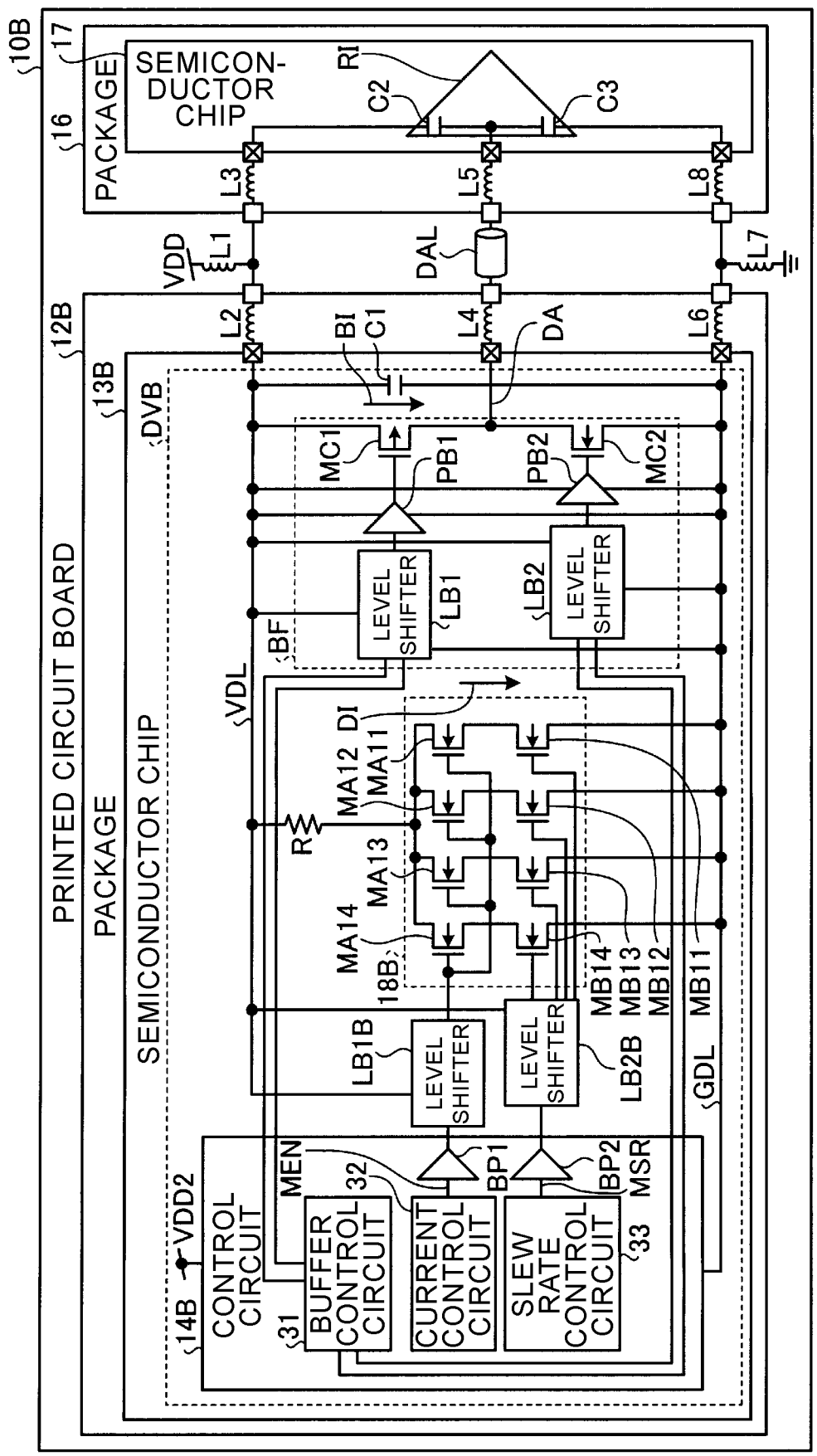
FIG. 6 is a block diagram illustrating a schematic configuration of a transmission interface circuit used in a data transmission device according to a fourth embodiment.

FIG. 6 is a block diagram illustrating a schematic configuration of a transmission interface circuit used in a data transmission device according to a fourth embodiment. In the configuration of FIG. 6, a printed circuit board 10B is provided in place of the printed circuit board 10A of FIG. 2. The printed circuit board 10B includes a package 12B mounted thereon in place of the package 12A of FIG. 2. A semiconductor chip 13B is sealed in the package 12B.

The semiconductor chip 13B is formed with a data driver DVB in place of the data driver DVA. In the data driver DVB, a control circuit 14B, level shifters LB1B and LB2B, and a current circuit 18B are provided in place of the control circuit 14A, the level shifters LB1A and LB2A, and the current circuit 18A in FIG. 2.

The current circuit 18B is able to make a dummy current DI flow to the power supply line VDL. The current circuit 18B may be connected in parallel with the buffer circuit BF between the power supply line VDL and the ground line GDL. The current circuit 18B is able to make the dummy current DI flow complementarily to the buffer current BI flowing in the buffer circuit BF. The current circuit 18B is provided with N-channel transistors MA11 to MA14 and MB11 to MB14.

The N-channel transistors MA11 to MA14 and the N-channel transistors MB11 to MB14 are connected in series to each other, and the serial circuit thereof is connected between the power supply line VDL and the ground line GDL. A resistor R may be connected between the series circuit and the power supply line VDL. The linearity of the current circuit 18B may be improved by connecting the resistor R.

The level shifters LB1B and LB2B are able to convert the level of the output voltage and drive the current circuit 18B. The level shifter LB1B may be configured to have one input and one output, and the level shifter LB2B may be configured to have one input and four outputs. The output of the level shifter LB1B is connected in common to the gates of the N-channel transistors MA11 to MA14. The outputs of the level shifter LB2B are connected individually to the gates of the N-channel transistors MB11 to MB14.

The control circuit 14B is able to control the switching operation of the current circuit 18B and the buffer circuit BF. The control circuit 14B is provided with a buffer control circuit 31, a current control circuit 32, and a slew rate control circuit 33. The buffer control circuit 31 is able to control the switching operation of the buffer circuit BF based on the voltage level set in the transmission data DA. The output of the buffer control circuit 31 is connected to the inputs of the level shifters LB1 and LB2. The current control circuit 32 is able to control the dummy current DI based on the voltage level set in the transmission data DA or a transmission timing of the transmission data DA. The output of the current control circuit 32 is connected to the inputs of the level shifter LB1B via the buffer BP1. The current control circuit 32 is able to set the level of a dummy enable signal MEN to high when turning on the dummy current DI, and to set the level of the dummy enable signal MEN to low when turning off the dummy current DI. The slew rate control circuit 33 is able to control the slew rate of the dummy current DI. The output of the slew rate control circuit 33 is connected to the input of the level shifter LB2B via the buffer BP2. When controlling the slew rate, the slew rate control circuit 33 may designate the number of the n-channel transistors MB11 to MB14 to be turned on by the slew rate control signal MSR. With the configuration of FIG. 6, it is possible to control not only the slew rate, but also the magnitude of the dummy current DI by the slew rate control signal MSR. In the configuration of FIG. 6, the slew rate and the magnitude of the dummy current DI may be controlled in four stages.

Before the transmission data DA is transmitted from the buffer circuit BF, the buffer control circuit 31 turns off the output buffer MC1 and turns on the output buffer MC2. Therefore, the level of the transmission data DA is set to low. At this time, the buffer current BI does not flow through the buffer circuit BF.

When the transmission data DA is transmitted from the buffer circuit BF, the output buffers MC1 and MC2 are turned on/off. At this time, when setting the level of the transmission data DA to high, the buffer control circuit 31 turns on the output buffer MC1 and turns off the output buffer MC2. When setting the level of the transmission data DA to low, the buffer control circuit 31 turns off the output buffer MC1 and turns on the output buffer MC2.

When the level of the transmission data DA is low, the buffer current BI does not flow through the buffer circuit BF. When the level of the transmission data DA is high, the buffer current BI flows through the buffer circuit BF. At this time, the dummy current DI may flow at the time when the buffer current BI does not flow before the transmission data DA is transmitted and while the transmission data DA is transmitted.

Here, in order to control the slew rate when the dummy current DI flows, the slew rate control signal MSR is output from the slew rate control circuit 33. One or more N-channel transistors among the four N-channel transistors MB11 to MB14 are turned on by the slew rate control signal MSR.

Further, in the current control circuit 32, the dummy enable signal MEN rises when the level of the transmission data DA is low. At this time, the N-channel transistors MA11 to MA14 are turned on, and the dummy current DI flows through the current circuit 18B.

Meanwhile, in the current control circuit 32, the dummy enable signal MEN falls when the level of the transmission data DA is high. At this time, the N-channel transistors MA11 to MA14 are turned off, and the dummy current DI does not flow through the current circuit 18B.

As a result, when the buffer current BI does not flow, the dummy current DI may flow instead of the buffer current BI while adjusting the slew rate of the dummy current DI. Therefore, even when the parasitic inductances L1 and L2 are present between the power supply voltage VDD and the power supply line VDL, it is possible to suppress the occurrence of the induced electromotive force by the parasitic inductances L1 and L2. Thus, it is possible to reduce the variation in the power supply voltage VDDIO caused by the switching operation of the buffer circuit BF.

The data driver DVB in FIG. 6 may be applied to each of the data drivers DV0 to DV7 in FIG. 1. At this time, the respective dummy enable signals MEN0 to MEN7 of the data drivers DV0 to DV7 may be set by the method of FIG. 3, the method of FIG. 4, or the method of FIG. 5. In the data transmission period HD2, the slew rate control signal MSR remains constant.

Fifth Embodiment

Figure 7:
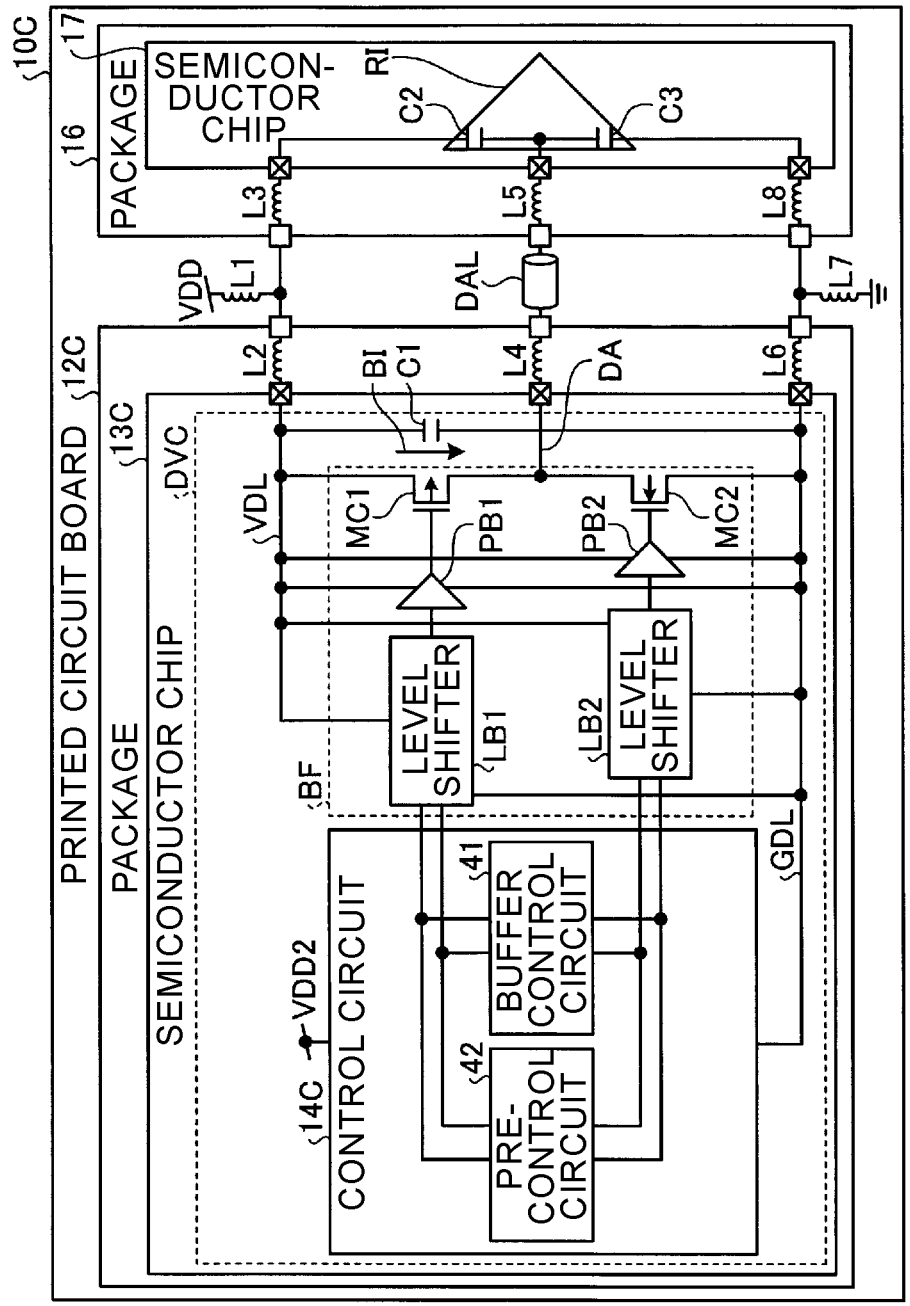
FIG. 7 is a block diagram illustrating a schematic configuration of a transmission interface circuit used in a data transmission device according to a fifth embodiment.

FIG. 7 is a block diagram illustrating a schematic configuration of a transmission interface circuit used in a data transmission device according to a fifth embodiment. In the configuration of FIG. 7, a printed circuit board 10C is provided in place of the printed circuit board 10A of FIG. 2. The printed circuit board 10C includes a package 12C mounted thereon in place of the package 12A of FIG. 2. A semiconductor chip 13C is sealed in the package 12C.

The semiconductor chip 13C is formed with a data driver DVC in place of the data driver DVA. In the data driver DVC, a control circuit 14C is provided in place of the control circuit 14A, the level shifters LB1A and LB2A, and the current circuit 18A in FIG. 2.

The control circuit 14C is able to control the switching operation of the buffer circuit BF. The control circuit 14C is provided with a buffer control circuit 41 and a pre-control circuit 42. The buffer control circuit 41 is able to control the switching operation of the buffer circuit BF based on the level set in the transmission data DA. The output of the buffer control circuit 41 is connected to the inputs of the level shifters LB1 and LB2. The pre-control circuit 42 may switch the buffer circuit BF M times (M is an integer of 2 or more) before the transmission data DA is transmitted. The output of the pre-control circuit 42 is connected to the inputs of the level shifters LB1 and LB2.

Before the transmission data DA is transmitted from the buffer circuit BF, the pre-control circuit 42 turns on/off the output buffers MC1 and MC2 alternately. Therefore, the level of the transmission data DA alternately repeats low and high. At this time, when the level of the transmission data DA is low, the buffer current BI does not flow through the buffer circuit BF. When the level of the transmission data DA is high, the buffer current BI flows through the buffer circuit BF.

Here, before the transmission data DA is transmitted, the differential clock signals CLK and CLKB of FIG. 1 are not transmitted. Therefore, even when the level of the transmission data DA alternately repeats low and high before the transmission data DA is transmitted, the transmission data DA is not received on the side of the data receiver RI.

Before the transmission data DA is transmitted from the buffer circuit BF, the buffer control circuit 41 turns on/off the output buffers MC1 and MC2. At this time, when setting the level of the transmission data DA to high, the buffer control circuit 41 turns on the output buffer MC1 and turns off the output buffer MC2. When setting the level of the transmission data DA to low, the buffer control circuit 41 turns off the output buffer MC1 and turns on the output buffer MC2. At this time, when the level of the transmission data DA is low, the buffer current BI does not flow through the buffer circuit BF. When the level of the transmission data DA is high, the buffer current BI flows through the buffer circuit BF.

Here, when the transmission data DA is transmitted, the differential clock signals CLK and CLKB of FIG. 1 are transmitted. Therefore, when the transmission data DA is transmitted, the transmission data DA is received on the side of the data receiver RI.

This allows the buffer current BI to flow before the transmission data DA is transmitted together with the differential clock signals CLK and CLKB. When the transmission data DA is transmitted together with the differential clock signals CLK and CLKB, it is possible to prevent abrupt change in the current flowing from the power supply voltage VDD to the power supply line VDL. Therefore, even when the parasitic inductances L1 and L2 are present between the power supply voltage VDD and the power supply line VDL, it is possible to reduce the variation in the power supply voltage VDDIO caused by the switching operation of the buffer circuit BF when the data transmission data DA is transmitted together with the differential clock signals CLK and CLKB.

Figure 8:
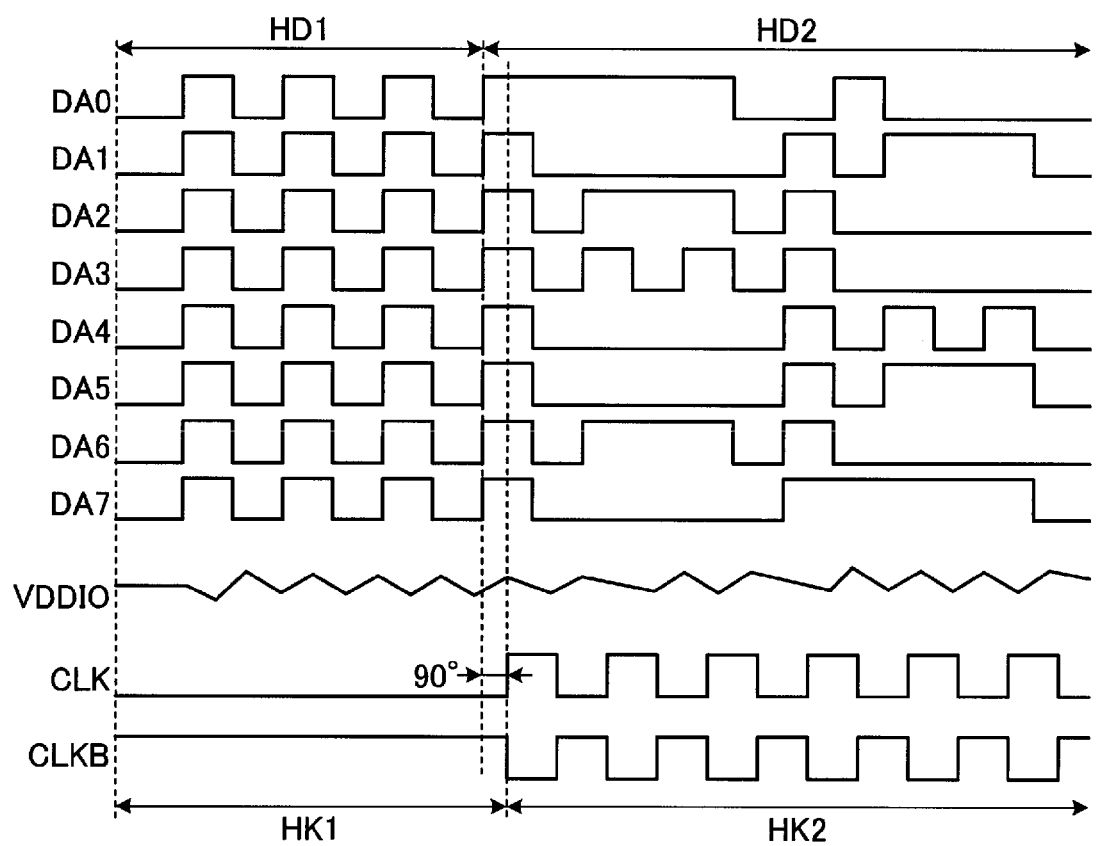
FIG. 8 is a timing chart illustrating waveforms of respective parts of the data transmission device according to the fifth embodiment.

FIG. 8 is a timing chart illustrating waveforms of respective parts of the data transmission device according to the fifth embodiment. FIG. 8 illustrates output waveforms of the clock driver 4 and the data drivers DV0 to DV7 in FIG. 1 in a case where the configuration of the data driver DVC in FIG. 7 is applied to the respective data drivers DV0 to DV7 in FIG. 1. In FIG. 8, a clock non-transmission period HK1, a clock transmission period HK2, a data non-transmission period HD1, and a data transmission period HD2 are provided as in the timing chart of FIG. 3. In the method of FIG. 3, the dummy current DI flows through the current circuit 18A in the data non-transmission period HD1. In contrast, in the method of FIG. 8, the buffer current BI flows through the buffer circuit BF in the data non-transmission period HD1.

In the data non-transmission period HD1, the levels of the transmission data DA0 to DA7 alternately repeat low and high in order to feed the buffer current BI. At this time, the differential clock signals CLK and CLKB are not transmitted. Therefore, even when the levels of the transmission data DA0 to DA7 alternately repeat low and high, the data reception device 5 may be suppressed from receiving the transmission data DA0 to DA7.

This suppression allows the buffer current BI to flow before the transmission data DA0 to DA7 are transmitted. When the transmission data DA is transmitted, it is possible to prevent abrupt change in the current flowing from the power supply voltage VDD to the power supply line VDL. Therefore, even when the parasitic inductances L1 and L2 are present between the power supply voltage VDD and the power supply line VDL, it is possible to reduce the variation in the power supply voltage VDDIO caused by the switching operation of the buffer circuit BF in the data transmission period HD2. As a result, it is possible to reduce the deviation of the duty ratios of the differential clock signals CLK and CLKB, and to reduce the skew between the differential clock signals CLK and CLKB and the transmission data DA0 to DA7.

In the data non-transmission period HD1, when the levels of the transmission data DA0 to DA7 alternately repeat low and high, a large drop in the power supply voltage VDDIO occurs, especially at the first rise of the transmission data DA0 to DA7. At this time, the differential clock signals CLK and CLKB are not transmitted, so that the duty ratio deviations of the differential clock signals CLK and CLKB and the skew between the differential clock signals CLK and CLKB and the transmission data DA0 to DA7 do not occur.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data transmission device comprising:
   a clock driver configured to issue a clock signal;
   a buffer circuit configured to set a voltage level of a data signal to high or low, the data signal being issued according to the clock signal;
   a buffer control circuit configured to control a switching operation of the buffer circuit;
   a current circuit configured to make a dummy current flow from a first end of the current circuit to a second end thereof, the second end being connected to a ground line;
   a power supply line connected to the first end of the current circuit and by which a power supply voltage is applied to the buffer circuit and the current circuit; and
   a current control circuit configured to control the current circuit to make the dummy current flow during a time period no current is flowing in the buffer circuit, based on one of the set voltage level and a transmission timing of the data signal, wherein
   the current circuit is configured to make the dummy current flow before the data signal is issued according to the clock signal.

2. The data transmission device according to claim 1, further comprising:
   a slew rate control circuit configured to control a slew rate of the dummy current.

3. The data transmission device according to claim 2, wherein the slew rate control circuit is further configured to turn on one or more transistors with a slew rate control signal.

4. The data transmission device according to claim 3, wherein a magnitude of the dummy current is controlled by the slew rate control signal.

5. The data transmission device according to claim 3, wherein the one or more transistors are N-channel transistors.

6. The data transmission device according to claim 1, wherein the dummy current is configured to reduce variation in the power supply voltage.

7. The data transmission device according to claim 1, wherein the time period includes a time period in which the voltage level of the data signal is set to low.

8. The data transmission device according to claim 1, wherein the current circuit is configured to make the dummy current not flow when the voltage level of the data signal is high, and make the dummy current flow when the voltage level of the data signal is low.

* * * * *